(12) United States Patent
Kim et al.

(10) Patent No.: US 11,812,594 B2
(45) Date of Patent: Nov. 7, 2023

(54) DISPLAY APPARATUS

(71) Applicant: LG Display Co., Ltd., Seoul (KR)

(72) Inventors: Won-Tae Kim, Chilgok-gun (KR); Se-Hwan Jeon, Busan (KR)

(73) Assignee: LG Display Co., Ltd., Seoul (KR)

( * ) Notice: Subject to any disclaimer, the term of this patent is extended or adjusted under 35 U.S.C. 154(b) by 297 days.

(21) Appl. No.: 17/129,260

(22) Filed: Dec. 21, 2020

(65) Prior Publication Data

US 2021/0195812 A1 Jun. 24, 2021

(30) Foreign Application Priority Data

Dec. 23, 2019 (KR) ........................ 10-2019-0173041

(51) Int. Cl.
| | | |
|---|---|---|
| *H05K 7/20* | (2006.01) | |
| *H01L 25/18* | (2023.01) | |
| *H05K 1/18* | (2006.01) | |
| *H05K 9/00* | (2006.01) | |
| *H05K 1/14* | (2006.01) | |
| *H10K 50/84* | (2023.01) | |
| *H10K 59/40* | (2023.01) | |

(52) U.S. Cl.
CPC ......... *H05K 7/20954* (2013.01); *H01L 25/18* (2013.01); *H05K 1/147* (2013.01); *H05K 1/189* (2013.01); *H05K 7/20127* (2013.01); *H05K 9/0024* (2013.01); *H10K 50/84* (2023.02); *H05K 2201/056* (2013.01); *H05K 2201/10128* (2013.01); *H10K 59/40* (2023.02)

(58) Field of Classification Search
CPC ........... H05K 7/20954; H05K 7/20127; H05K 7/20972; H05K 1/147; H05K 1/189; H05K 9/0024; H05K 2201/056; H05K 2201/10128; H01L 25/18; H01L 51/5237; H01L 51/52; H01L 27/323; H01L 27/3244; H01L 27/32; G02F 1/13306; G09F 9/33; B60K 35/00; B60K 2370/60
USPC ......................................................... 361/693
See application file for complete search history.

(56) References Cited

U.S. PATENT DOCUMENTS

| | | | | |
|---|---|---|---|---|
| 2009/0225252 A1* | 9/2009 | Jeong | ................ | G02F 1/133308 362/97.1 |
| 2014/0169033 A1* | 6/2014 | Yu | ........................ | H05K 5/0017 29/831 |
| 2018/0027671 A1* | 1/2018 | Kang | ................... | H05K 5/0013 361/707 |

(Continued)

FOREIGN PATENT DOCUMENTS

| | | | | |
|---|---|---|---|---|
| JP | 5002292 B2 * | 8/2012 | ............... | G09F 9/00 |
| KR | 10-2006-0081590 A | 7/2006 | | |

(Continued)

*Primary Examiner* — Anatoly Vortman
*Assistant Examiner* — Zhengfu J Feng
(74) *Attorney, Agent, or Firm* — Seed IP Law Group LLP

(57) ABSTRACT

The present disclosure provides a display apparatus. The display apparatus includes a display module including a display panel and a guide plate, a flexible printed circuit board extending from the display panel, a source printed circuit board connected to the flexible printed circuit board and attached to the guide plate, at least one driving chip disposed on the source printed circuit board, and a protective member disposed to cover the flexible printed circuit board, the source printed circuit board, and the driving chip.

19 Claims, 6 Drawing Sheets

(56) References Cited

U.S. PATENT DOCUMENTS

2018/0146579 A1* 5/2018 Kim ................. H05K 13/04
2018/0180939 A1* 6/2018 Kim ................. G02F 1/133608

FOREIGN PATENT DOCUMENTS

| KR | 20060109783 A | * | 10/2006 | ............ H01J 17/28 |
| KR | 20090110728 A | * | 10/2009 | ........... G02F 1/1333 |
| KR | 10-1503308 B1 | | 3/2015 | |

* cited by examiner

610

620

630

DISPLAY APPARATUS

CROSS-REFERENCE TO RELATED APPLICATION(S)

This application claims the benefit of Korean Patent Application No. 10-2019-0173041, filed on Dec. 23, 2019, which is hereby incorporated by reference as if fully set forth herein.

TECHNICAL FIELD

The present disclosure relates to a display apparatus, and more particularly to a display apparatus in which a display panel is bendable.

DISCUSSION OF THE RELATED ART

Recently, with the arrival of the information age, the field of displays for visually displaying electrically conveyed information signals has rapidly developed. In response thereto, various kinds of display apparatuses having excellent characteristics, such as a small thickness, low weight, and low power consumption, have been developed.

Representative examples of such display apparatuses include a liquid crystal display (LCD) apparatus, an organic light-emitting display (OLED) apparatus, and a quantum dot display apparatus.

Among these, a self-illuminating display apparatus, such as an organic light-emitting display apparatus, is considered a competitive application because it does not require a separate light source and enables the realization of a compact apparatus design and vivid color display. A display apparatus includes a self-illuminating element, which is provided in each subpixel. The light-emitting element includes two electrodes, which are opposite each other, and a light-emitting layer, which is disposed between the two electrodes and emits light when electrons and holes, which are transported, are recombined with each other. In addition, the display apparatus may include a display panel and multiple components for providing various functions. For example, one or more display-driving circuits for controlling a display panel may be included in a display assembly. Examples of the driving circuits include gate drivers, emission (source) drivers, power (VDD) routing, electrostatic discharge (ESD) circuits, multiplex (MUX) circuits, data signal lines, cathode contacts, and other functional elements. A number of peripheral circuits for providing various extra functions, such as touch-sensing or fingerprint identification functions, may be included in the display assembly. Some of the components may be disposed on the display panel, or may be disposed on a film or a printed circuit board that is disposed outside the display panel.

An organic light-emitting diode is a self-illuminating element that uses a thin light-emitting layer between electrodes, and thus has an advantage of realization of a small thickness. In addition, since an organic light-emitting diode is implemented without a separate light source, a flexible, bendable, or foldable display apparatus may be easily implemented using the organic light-emitting diode, and may further be formed in various designs.

A display apparatus, such as an organic light-emitting display apparatus including a self-illuminating element, is increasingly applied not only to typical electronic devices such as TVs but also in various other fields, for example, as various parts of vehicles, such as an instrument panel, a windshield, a display of a mirror, and indoor and outdoor light guide plates. As such, each display apparatus may be optimized for use in certain environments.

BRIEF SUMMARY

Accordingly, the present disclosure is directed to a display apparatus that substantially obviates one or more problems due to limitations and disadvantages of the related art.

The present disclosure has been provided to solve the problems described above, and an object of the present disclosure is to provide a display apparatus suitable for a vehicle, which exhibits a uniform display function while overcoming the harsh environment inherent to a vehicle. These days, the range of fields in which a display apparatus is used is expanding. For example, in recently developed vehicles, not only instrument panels but also infotainment systems such as a navigation system have been replaced by display apparatuses. However, due to the characteristics of a vehicle, a display apparatus is exposed to the external environment. In particular, a display apparatus embedded in a dashboard, which is located adjacent to an engine compartment, which dissipates high-temperature heat, may be subjected to extreme temperatures. The heat generated by drivers or other components included in a display apparatus may not be sufficiently dissipated, but may remain near the display apparatus. Such high temperatures may cause electronic devices such as drivers to malfunction, resulting in abnormal operation of the display screen.

In addition, while the vehicle is traveling, vibration or foreign substances may cause damage to electronic devices included in the display apparatus. Foreign substances generated in the vehicle may adhere to a printed circuit board, on which electronic devices such as drivers included in the display apparatus are disposed. The foreign substances adhered to the printed circuit board may be electrically conductive, which may thus lead to an electrical short in the printed circuit board.

In order to solve the above problems, another object of the present disclosure is to provide a display apparatus including a member enabling sufficient dissipation of heat generated in components and preventing foreign substances from coming into contact with a printed circuit board.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a display apparatus according to an embodiment of the present disclosure may include a guide plate disposed on the rear surface of a display panel, a printed circuit board disposed on the top surface of the guide plate, a component disposed on the top surface of the printed circuit board, and a cover shield configured to cover the printed circuit board and the component.

A display apparatus according to another embodiment of the present disclosure may include a display module including a display panel and a guide plate, a flexible printed circuit board extending from the display panel, a source printed circuit board connected to the flexible printed circuit board and attached to the guide plate, at least one driving chip disposed on the source printed circuit board, and a cover shield disposed to cover the flexible printed circuit board, the source printed circuit board, and the driving chip.

According to another embodiment of the present disclosure, a display device for a vehicle is provided, wherein the display device comprises any one of above display apparatus.

It is to be understood that both the foregoing general description and the following detailed description of the disclosure are exemplary and explanatory and are intended to provide further explanation of the disclosure as claimed.

DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
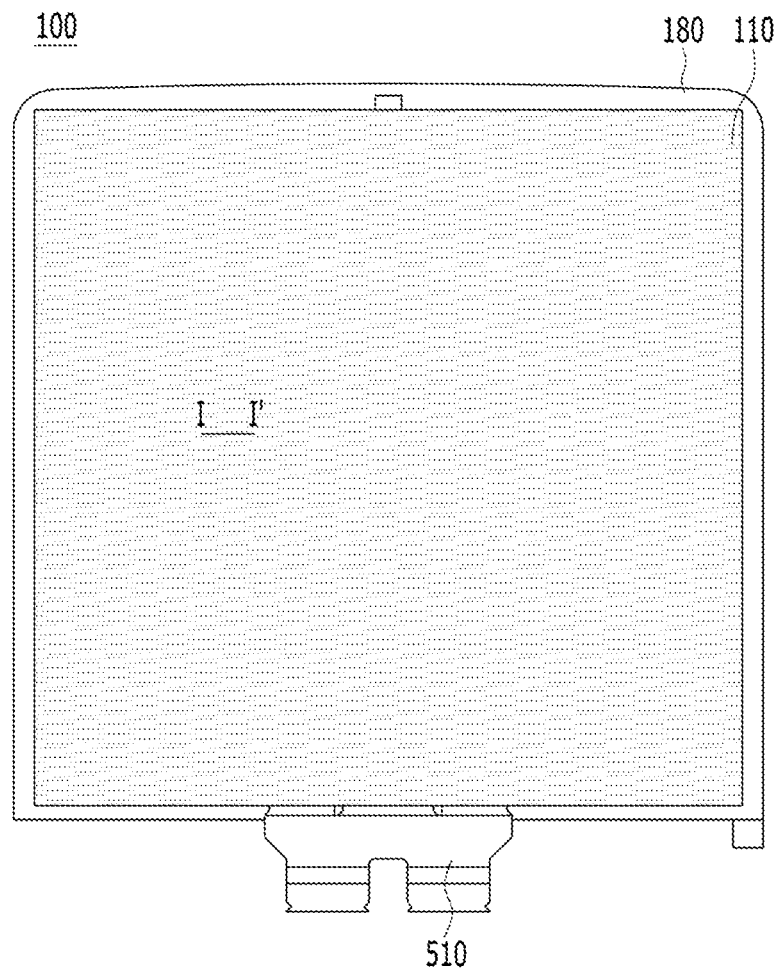
FIG. 1 is a plan view showing a front surface of a display apparatus according to an embodiment of the present disclosure.

Advantages and features of the present disclosure and methods for achieving the same will be made clear from the embodiments described below in detail with reference to the accompanying drawings. The present disclosure may, however, be embodied in many different forms, and should not be construed as being limited to the embodiments set forth herein. Rather, these embodiments are provided so that this disclosure will be thorough and complete and will fully convey the scope of the present disclosure to those skilled in the art. The present disclosure is defined only by the scope of the claims.

In the drawings for explaining the exemplary embodiments of the present disclosure, for example, the illustrated shape, size, ratio, angle, and number are given by way of example, and thus do not limit the disclosure of the present disclosure. Throughout the present specification, the same reference numerals designate the same constituent elements. In addition, in the following description of the present disclosure, a detailed description of known functions and configurations incorporated herein will be omitted when it may make the subject matter of the present disclosure rather unclear. The terms "comprises," "includes," and/or "has," used in this specification, do not preclude the presence or addition of other elements unless used along with the term "only." Singular forms are intended to include the plural forms as well, unless the context clearly indicates otherwise.

In the interpretation of constituent elements included in the various embodiments of the present disclosure, the constituent elements are to be interpreted as including an error range even if there is no explicit description thereof.

In the description of the various embodiments of the present disclosure, when describing positional relationships, for example, when the positional relationship between two parts is described using "on," "above," "below," "next to," or the like, one or more other parts may be located between the two parts, unless the term "directly" or "closely" is used.

In the description of the various embodiments of the present disclosure, when describing temporal relationships, for example, when the temporal relationship between two actions is described using "after," "subsequently," "next," "before," or the like, the actions may not occur in succession, unless the term "directly" or "just" is used therewith.

In the description of the various embodiments of the present disclosure, although terms such as, for example, "first" and "second" may be used to describe various elements, these terms are merely used to distinguish the same or similar elements from each other. Therefore, in the present specification, an element indicated by "first" may be the same as an element indicated by "second," without exceeding the technical scope of the present disclosure, unless otherwise mentioned.

Additionally, terms such as "first," "second," "A," "B," "(a)," "(b)," etc., may be used herein to describe the components of the embodiments. These terms are only used to distinguish one element from another element, and the essence, order, or sequence of corresponding elements is not limited by these terms. It should be noted that when it is described in the specification that one component is "connected," "coupled," or "joined" to another component, the former may be directly "connected," "coupled," or "joined" to the latter, intervening components may be present, or the former may be indirectly "connected," "coupled," or "joined" to the latter via yet another component.

In the description of the present disclosure, examples of a display apparatus may include a display apparatus in the narrow sense, such as a liquid crystal module (LCM), an organic light-emitting display (OLED) module, or a quantum dot (QD) module, which includes a display panel and a driver for driving the display panel. Further examples of the display apparatus may include a set device (or a set apparatus) or a set electronic apparatus, such as a laptop computer, a television, a computer monitor, an equipment apparatus including an automotive display or other type of vehicular apparatus, or a mobile electronic apparatus such as a smartphone or an electronic pad, which is a complete product (or a final product), including an LCM, an OLED module, or a QD module.

Therefore, in the description of the present disclosure, examples of the display apparatus may include a display apparatus itself in the narrow sense, such as an LCM, an OLED module, or a QD module, and a set apparatus, which is an application product or a final consumer apparatus including the LCM, the OLED module, or the QD module.

In some cases, an LCM, an OLED module, or a QD module, which includes a display panel and a driver, may be referred to as a "display apparatus in the narrow sense," and an electronic apparatus that is a final product including an LCM, an OLED module, or a QD module may be referred to as a "set apparatus." For example, the display apparatus in the narrow sense may include a display panel, such as an LCD, an OLED, or a QD, and a source printed circuit board (PCB), which is a controller for driving the display panel. The set apparatus may further include a set PCB, which is a set controller electrically connected to the source PCB to control the entirety of the set apparatus.

A display panel applied to the embodiment may use any type of display panel, such as a liquid crystal display panel, an organic light-emitting diode (OLED) display panel, a quantum dot (QD) display panel, or an electroluminescent display panel, but is not limited thereto, and may be applied to any type of display panel that is capable of realizing bezel bending using a flexible substrate for an OLED display panel of the embodiment and an underlying backplate support structure. Further, the shape or size of a display panel applied to a display apparatus according to the embodiment of the present disclosure is not particularly limited.

For example, when the display panel is an OLED display panel, the display panel may include a plurality of gate lines, a plurality of data lines, and a plurality of pixels respectively provided in a plurality of pixel areas defined by intersections of the gate lines and the data lines. In addition, the display panel may include an array including a thin-film transistor, which is an element for selectively applying a voltage to each of the pixels, an OLED layer on the array, and an encapsulation substrate or an encapsulation layer disposed on the array to cover the OLED layer. The encapsulation layer may protect the thin-film transistor and the OLED layer from external impacts, and may prevent moisture or oxygen from permeating the OLED layer. In addition, a layer provided on the array may include an inorganic light-emitting layer, e.g., a nano-sized material layer, a quantum dot, or the like.

An organic light-emitting diode (OLED) display panel 100 is illustrated by way of example in FIG. 1 as a display panel that is capable of being integrated with a display apparatus according to the present disclosure.

FIG. 1 is a view showing a display apparatus 100 according to an embodiment of the present disclosure.

Referring to FIG. 1, the display apparatus 100 may have a rectangular or square shape, and may be applied to a center fascia of a vehicle. The shape of the display apparatus 100 is not necessarily limited to a quadrangular shape, but the display apparatus 100 may be formed in any of various other shapes, such as a polygonal shape or a shape having a curved portion.

Referring to FIG. 1, the display apparatus 100 has a display function and a touch function that are integrated. A cover member 180 is provided at the front side of the display apparatus 100. A display panel 110 for the display function may be disposed on the rear surface of the cover member 180. A touch flexible printed circuit board 510 for the touch function may be disposed at a lower side. The display apparatus 100 may be inserted into and coupled to the dashboard of a vehicle. The display panel 110 may be implemented as a substrate formed of a rigid material. However, in the case of an OLED, the display panel 110 may be implemented as a flexible substrate. When implemented as a flexible substrate, the display panel 110 may be deformed concavely or convexly according to the shape of the dashboard, and may thus be freely designed. The cover member 180 may be referred to as a cover glass, but is not limited to any particular term.

Figure 2:
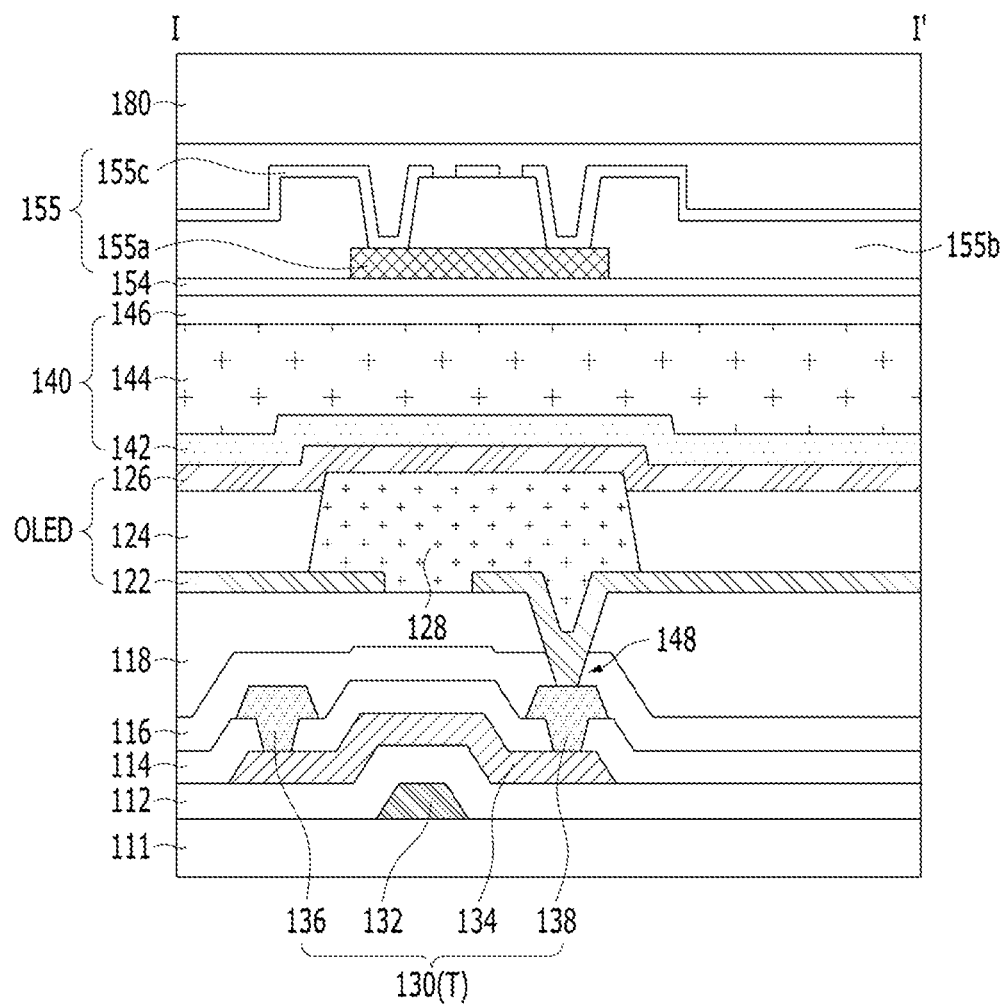
FIG. 2 is an enlarged cross-sectional view of a light-emitting element along line I-I' in FIG. 1.

FIG. 2 shows a cross-sectional structure of the light-emitting element taken along line I-I' in FIG. 1. A substrate 111 may support various components of the display panel 110. The substrate 111 may be formed of a transparent insulating material, e.g., glass or plastic. When the substrate 111 is formed of plastic, the substrate 111 may be referred to as a plastic film or a plastic substrate. For example, the substrate 111 may take the form of a film including one selected from the group consisting of a polyimide-based polymer, a polyester-based polymer, a silicon-based polymer, an acrylic polymer, a polyolefin-based polymer, and a copolymer thereof. Among these materials, polyimide may be applied to a high-temperature process and may be applied by coating, and thus is mainly used for a plastic substrate.

A buffer layer (which is not illustrated in FIG. 2) may be located on the substrate 111. The buffer layer is a functional layer for protecting the thin-film transistor (TFT) from impurities, such as alkali ions, discharged from the lower side of the substrate 111. The buffer layer may be formed of silicon oxide (SiOx), silicon nitride (SiNx), or multiple layers thereof.

A thin-film transistor 130 may be disposed on the buffer layer. The thin-film transistor 130 may have a structure in which a gate electrode 132, a gate-insulating film 112, a semiconductor layer 134, a first interlayer insulating film 114, and source and drain electrodes 136 and 138 are sequentially stacked. At least one thin-film transistor 130 may be disposed in a plurality of subpixels provided in an active area.

The thin-film transistor 130 shown in FIG. 2 is of a bottom-gate type, without being necessarily limited thereto. A top-gate type, in which the sequence in which the semiconductor layer 134 and the gate electrode 132 are formed is reversed, may also be applied.

The semiconductor layer 134 may be disposed on a specific portion of the substrate 111 or the buffer layer. The semiconductor layer 134 may be formed of polysilicon (p-Si). In this case, a predetermined area in the semiconductor layer 134 that needs to be an electrode layer may be doped with an impurity. Further, the semiconductor layer 134 may be formed of amorphous silicon (a-Si), or may be formed of various organic semiconductor materials such as pentacene. Alternatively, the semiconductor layer 134 may be formed of oxide. The gate-insulating film 112 may be formed of an insulating inorganic material such as silicon oxide (SiOx) or silicon nitride (SiNx), or may be formed of an insulating organic material or the like. The gate electrode 132 may be formed of various conductive materials such as magnesium (Mg), aluminum (Al), nickel (Ni), chromium (Cr), molybdenum (Mo), tungsten (W), gold (Au), or alloys thereof.

The first interlayer insulating film 114 may be formed of an insulating inorganic material such as silicon oxide (SiOx) or silicon nitride (SiNx), or may be formed of an insulating organic material or the like. A contact hole, through which source and drain regions are exposed, may be formed by selectively removing the first interlayer insulating film 114.

The source and drain electrodes 136 and 138 may be formed of an electrode material in a single-layered or multi-layered structure on the first interlayer insulating film 114.

An inorganic protective film 116 and a planarization layer 118 may be located on the thin-film transistor while covering the source and drain electrodes 136 and 138. The inorganic protective film 116 and the planarization layer 118 protect the thin-film transistor and flatten the upper portion of the same. The inorganic protective film 116 may be formed as an inorganic insulating film such as a silicon nitride (SiNx) film or a silicon oxide (SiOx) film, and the planarization layer 118 may be formed as an organic insulating film such as a benzocyclobutene (BCB) film or an acrylic film. Each of the inorganic protective film 116 and the planarization layer 118 may be formed in a single-layered, double-layered, or multi-layered structure. Any one of the inorganic protective film 116 and the planarization layer 118 may be omitted.

The light-emitting element, which is connected to the thin-film transistor (TFT) 130, may have a structure in which a first electrode 122, an organic light-emitting layer 124, and a second electrode 126 are sequentially stacked. That is, the light-emitting element may include the first electrode 122, which is connected to the drain electrode 138 through a connection hole 148 formed in the planarization layer 118 and the inorganic protective film 116, the organic light-emitting layer 124, which is located on the first electrode 122, and the second electrode 126, which is located on the organic light-emitting layer 124.

When the display panel 110 is of a top-emission type, in which light is radiated toward the region above the second electrode 126, the first electrode 122 may include an opaque conductive material having high reflectivity. The reflective conductive material may be, for example, silver (Ag), aluminum (Al), gold (Au), molybdenum (Mo), tungsten (W), chromium (Cr), or alloys thereof.

A bank 128 may be formed in the remaining region except for the emission region so as to open the emission region. Accordingly, the bank 128 has therein a bank hole that exposes a portion of the first electrode 122 that corresponds to the emission region. The bank 128 may be formed of an inorganic insulating material, such as silicon nitride (SiNx) or silicon oxide (SiOx), or an organic insulating material such as BCB, acrylic-based resin or imide-based resin.

The organic light-emitting layer 124 is located on the portion of the first electrode 122 that is exposed by the bank 128. The organic light-emitting layer 124 may include a hole injection layer, a hole transport layer, a light-emitting layer, an electron transport layer, an electron injection layer, and the like. The organic light-emitting layer 124 may have a single light-emitting layer structure that emits a single light beam in a single stack, or may have a multiple-stack structure that includes multiple stacks and a single light-emitting layer of the same color in each stack. In this case, in order to display various colors, the subpixels may be arranged such that neighboring subpixels emit different colored light beams. For example, subpixels having red, green and blue light-emitting layers may be sequentially arranged side by side, or may be disposed so as to be spaced apart from each other. In particular, subpixels of a specific color may be arranged parallel to each other and the other subpixels may be disposed in diagonal directions so as to have a triangular-shaped or PenTile structure.

In some cases, subpixels for a white color may be further disposed. Alternatively, the organic light-emitting layer 124 may have an arrangement structure for displaying a white color by stacking multiple stacks including light-emitting layers emitting different colored light beams. In the case of displaying a white color using a stack structure, a separate color filter may be further provided in each subpixel.

The second electrode 126 is located on the organic light-emitting layer 124. When the display panel 110 is of a top-emission type, the second electrode 126 may be formed of a transparent conductive layer such as indium tin oxide (ITO) or indium zinc oxide (IZO), or may be formed of a semi-permeable metal or metal alloy such as magnesium-silver alloy (MgAg). Thus, the second electrode 126 may radiate light generated in the organic light-emitting layer 124 toward the region above the second electrode 126.

A capping layer (not shown) may be disposed above the second electrode 126. The capping layer may protect the light-emitting element, and may be formed of a material having a high refractive index, thereby helping extract the light radiated from the second electrode 126.

An encapsulation layer 140 may be disposed on the light-emitting element. The encapsulation layer 140 is configured to prevent permeation of oxygen and moisture from the outside in order to prevent oxidation of light-emitting material and electrode material. When the light-emitting element is exposed to moisture or oxygen, a pixel shrinkage phenomenon, in which the size of the emission region is reduced, may occur, or a dark spot may be formed in the emission region. The encapsulation layer 140 may be formed by alternately stacking inorganic films 142 and 146, which are formed of glass, metal, aluminum oxide (AlOx), or silicon (Si)-based material, and an organic film 144, which serves to mitigate stress between the respective layers due to bending of the display panel 110 and to enhance planarization performance. The organic film 144 may be formed of an organic insulating material such as acrylic resin, epoxy resin, polyimide, polyethylene, or silicon oxy-carbon (SiOC). The first and second inorganic films 142 and 146 serve to prevent the permeation of moisture or oxygen, and the organic film 144 serves to flatten the surface of the first inorganic film 142. When the encapsulation layer 140 is formed as multiple thin films, it makes the permeation path of moisture or oxygen long and complicated compared to that when formed as a single film, thereby making it difficult for moisture/oxygen to permeate to the light-emitting element.

A protective layer may be further formed between the light-emitting element and the encapsulation layer 140. The protective layer may function to protect the encapsulation layer 140, so that the side surface of the encapsulation layer 140 is not peeled off or the uniformity thereof is not affected during the process of forming the encapsulation layer 140.

Referring to FIG. 2, a polarization layer 154 may be disposed on the encapsulation layer 140. The polarization layer 154 may minimize the influence that the light generated by an external light source has on the semiconductor layer 134 or the organic light-emitting layer 124 when traveling into the display panel 110.

Referring to FIG. 2, a touch sensor layer 155 may be disposed on the polarization layer 154. The touch sensor layer 155 may have a structure in which a first touch electrode 155a and a second touch electrode 155c, one of which receives a voltage signal and the other one of which senses a voltage signal, cross each other. The first touch electrode 155a and the second touch electrode 155c may be patterned in a polygonal or circular shape on a touch insulating film 155b, and may be spaced apart from each other.

A cover member 180 may be disposed on the touch sensor layer 155. An adhesive layer may be further disposed between the touch sensor layer 155 and the cover member 180 so that the touch sensor layer 155 and the cover member 180 are bonded to each other.

Figure 3:
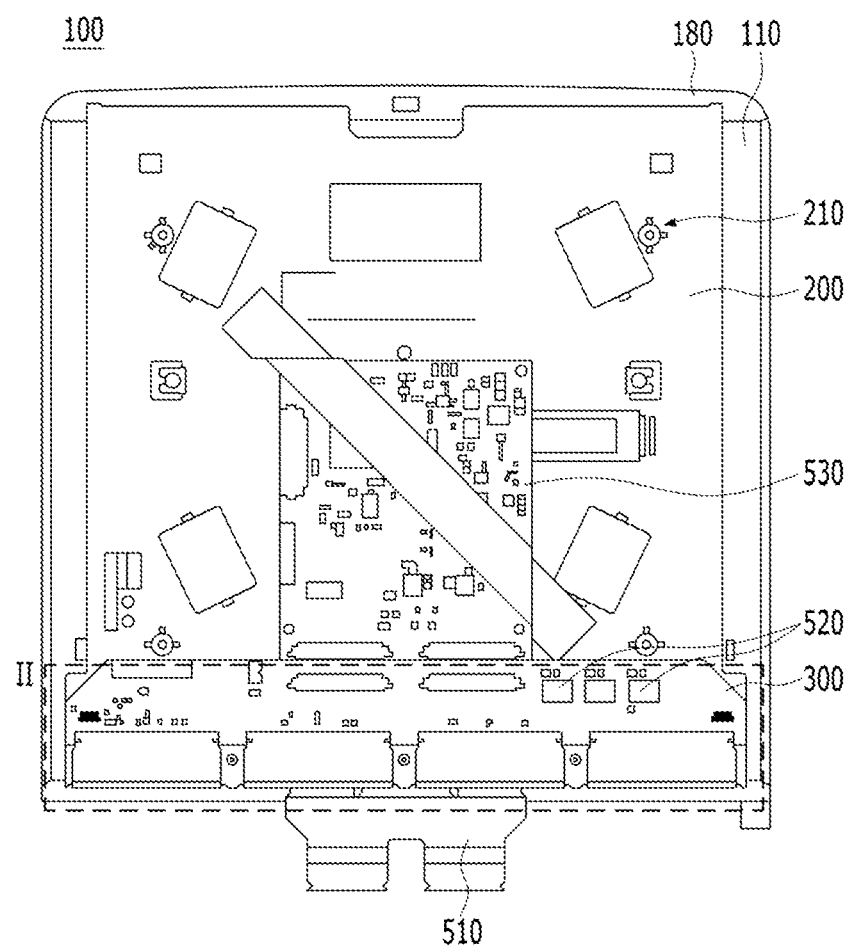
FIG. 3 is a plan view showing a rear surface of the display apparatus of FIG. 1.

FIG. 3 is a view showing the rear surface of the display apparatus 100 of FIG. 1. The display panel 110 may be disposed on the rear surface of the cover member 180, and the guide plate 200 may cover the entirety or a portion of the rear surface of the display panel 110. The guide plate 200 may be bonded to the rear surface of the display panel 110 to support the display panel 110, and may provide a structure by which the display apparatus 100, including the display panel 110 and the cover member 180, is capable of being inserted into and fixed to the dashboard of the vehicle. To this end, the guide plate 200 may be provided with a coupling portion 210 so as to be coupled to the dashboard of the vehicle. The coupling portion 210 may have a concave portion that is coupled to a protrusion formed on the dashboard. As shown in FIG. 3, four coupling portions 210 may be disposed at four points so that the display apparatus 100 is held in a balanced manner. However, the present disclosure is not limited to any particular number of coupling portions 210 or to the positions thereof. The guide plate 200 may have any of various planar structures according to the shape in which the display apparatus 100 is seated on the dashboard. For example, when the display apparatus 100 forms a concave plane on the dashboard, the display panel 110 and the cover member 180 are fixed to and supported by the concave plane of the guide plate 200 in a concave shape. In order to fix and support the display panel 110 and the cover member 180, the guide plate 200 may be formed of a metal material, such as copper, iron or aluminum, or a plastic material.

A source printed circuit board 300 and a control printed circuit board 530 may be fixed to a portion of the rear surface of the guide plate 200. When the display apparatus is inserted into the dashboard, workability may be improved by fixing the source printed circuit board 300 or the control printed circuit board 530 to the guide plate 200. For example, when the source printed circuit board 300 or the control printed circuit board 530 is not fixed, the printed circuit boards may be separated during the assembly process. The source printed circuit board 300 may first be attached to the lower portion of the guide plate 200 that is close to the display panel 110, and then the control printed circuit board 530 may be attached so as to extend from the source printed circuit board 300. The guide plate 200 may dissipate the heat generated from the display panel 110. When the display panel 110 is driven, heat may be generated from the light-emitting element when light is emitted therefrom. When this heat remains in the display panel 110, this may cause a problem of abnormal colors. The cover member 180 may be formed of a glass or plastic material having low thermal conductivity. Thus, the heat from the display panel 110 may be transferred to the guide plate 200 disposed at the back side. Referring to FIG. 3, a touch flexible printed circuit board 510, which is connected to a touch sensor layer 155 (refer to FIG. 2), may be provided, and may be connected to the source printed circuit board 300.

Figure 4:
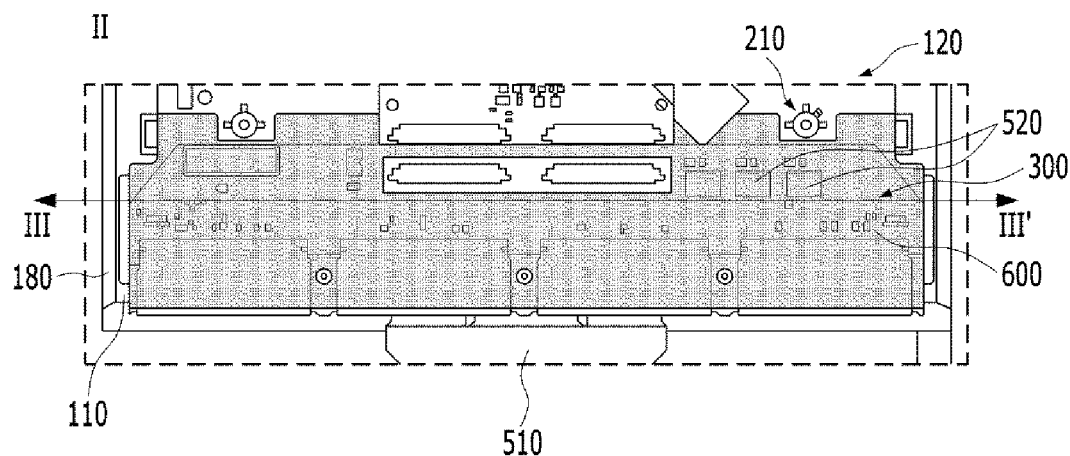
FIG. 4 is an enlarged plan view of area II in FIG. 3.

FIG. 4 is an enlarged plan view of portion II in FIG. 3. Although not illustrated in FIG. 3, a cover shield 600 may be disposed on the source printed circuit board 300. A drive integrated circuit (IC) and various driving chips 520 may be disposed on the source printed circuit board 300. The drive integrated circuit (IC) and driving chips 520 may collectively be referred to herein as components. The components drive the display apparatus 100, and a protective layer protects the same. For example, when foreign substances, such as dust or moisture, come into contact with the source printed circuit board 300, they may be adhered to wiring portions or components, which may cause a problem of an electrical short or the like. In order to protect the wiring portions and the components of the source printed circuit board 300, the cover shield 600 may be disposed on the source printed circuit board 300. Static electricity may be generated in the cover shield 600 due to friction. The cover shield 600 may extend to the guide plate 200, and may be attached thereto. The cover shield 600 may be grounded through the guide plate 200. As described above, similar to the generation of heat from the display panel 110 during light emission therefrom, the components including the driving chips 520 disposed on the source printed circuit board 300 may also generate heat. The heat generated from the components may remain at the cover shield 600. When the heat from the components remains between the source printed circuit board 300 and the cover shield 600, the drive IC or the driving chip 250 may operate abnormally, which may cause damage to the display panel 110 or increase power consumption. In the configuration having the cover shield 600, the temperature of the source printed circuit board 300 may increase by about 2.5° C., compared to the configuration having no cover shield. In order to prevent this heat stagnation phenomenon, the cover shield 600 according to the embodiment of the present disclosure has a structure for effectively dissipating heat. The cover shield 600 may be a protective member.

Figure 5:
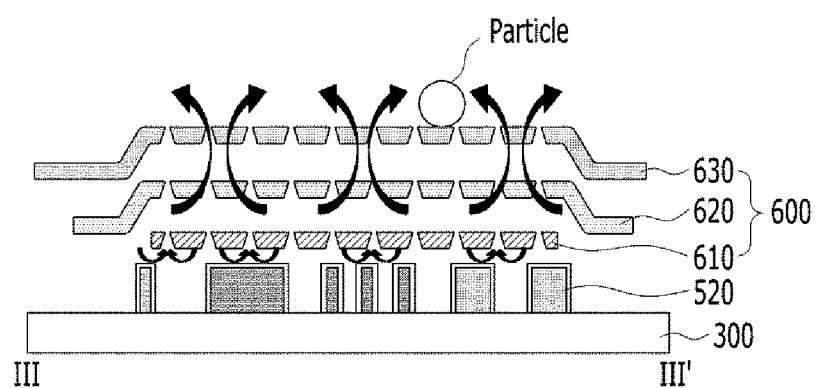
FIG. 5 is a cross-sectional view taken along line in FIG. 4.

FIG. 5 shows a cross-sectional structure taken along line in FIG. 4. Referring to FIG. 5, a plurality of driving chips 520 may be disposed on the source printed circuit board 300. The cover shield 600 may be disposed on the driving chips 520. The cover shield 600 may include a first layer 610, a second layer 620, and a third layer 630. The first layer 610 may be in direct contact with the drive IC or the driving chips 520. Thus, the first layer 610 is electrically insulative and has film characteristics for functioning as a base layer to form the foundation of the cover shield 600 and protect the components. To this end, the first layer 610 may be implemented as a plastic film such as polyethylene terephthalate (PET). The second layer 620 may be disposed on the first layer 610. In order to prevent the occurrence of an electrical short in the components of the source printed circuit board 300, the second layer 620 may be implemented as a piece of non-conductive tape that is highly insulative. The third layer 630, which is the top layer of the cover shield 600, may be implemented as a piece of conductive tape in order to prevent the source printed circuit board 300 from being affected by static electricity, which may be generated in the cover shield 600, as described above with reference to FIG. 4. Referring to FIG. 5, the first layer 610, the second layer 620, and the third layer 630 may have holes formed therein, through which air passes. The heat generated from the drive IC and the driving chips 520 may form an ascending air current due to convection characteristics. Hot air may ascend through the holes formed in the respective layers, and may be discharged to the outside. At the same time, cold external air may descend and enter the holes formed in the layers. For example, heat may be continuously generated from the driving chips 520, and hot air present near the driving chips 520 may ascend and sequentially pass through the first layer 610, the second layer 620, and the third layer 630, and may be discharged to the outside. At this time, air present in the region in which the driving chips 520 are absent may move laterally, and may fill the region near the driving chips 520, from which hot air has escaped. Further, cold external air may descend and fill the region in which the driving chips 520 are absent. The dissipation of heat from the driving chips 520 and the air convection may be realized through the holes formed in the cover shield 600. Using the air convection through the holes formed in the cover shield 600, the heat generated from the source printed circuit board 300 may be discharged, and cold external air may enter and cool the driving chips 520. The layers may be disposed so as to overlap each other such that the diametrical centers of the holes formed in the layers for air convection are aligned with each other. For example, in a region in which the components are disposed, the holes in the first layer 610, the holes in the second layer 620, and the holes in the third layer 630 are overlapped with each other. In particular, in the region in which the driving chips 520 are disposed, the holes may be disposed such that the diametrical centers thereof are aligned with each other in order to secure smooth ascent of hot air. In the region in which the heat-generating components such as the driving chips 520 are absent, the holes may not be aligned with each other. Some factors may need to be taken into consideration when the holes are formed in the cover shield 600. The cover shield 600 may be disposed in order to protect the source printed circuit board 300. For example, when the source printed circuit board 300 collides with an external object, the cover shield 600 may serve to absorb impacts and to prevent foreign substances from directly touching the source printed circuit board 300. If the holes formed in the cover shield 600 are larger than the foreign substances, it may defeat the above-described purpose of the cover shield 600. Therefore, the holes in the cover shield 600 may be formed to have a diameter that prevents fine foreign substance such as dust from passing therethrough. Considering the wiring structure and the connection structure of the components of the source printed circuit board 300, a metallic foreign substance having a diameter of about 400 μm may affect the source printed circuit board 300. Therefore, the holes may be formed to have a diameter that is smaller than the size of the metallic foreign substance. If the holes in the cover shield 600 do not have uniform diameters, the effect of dissipating the heat from the driving chips 520 may be greatly reduced. Further, there may be a limitation to the extent to which the diameters of the holes, which are formed in the first to third layers 610, 620 and 630 constituting the cover shield 600, can be reduced. A laser system may be used to form the holes in the respective layers. The laser system may be a picosecond laser system or a femtosecond laser system, without being necessarily limited thereto. A laser system is a device that emits light produced through a process of optical amplification of light generated by applying energy to a specific material based on stimulated emission of radiation. Since a laser has properties similar to those of a radio wave, is monochromatic, and has directivity, it is used in a communication field, a medical field, an industrial field, and the like. A laser makes it possible to form a desired pattern in a desired region or to easily remove a specific region. The picosecond laser system and the femtosecond laser system mentioned above are classified based on the laser radiation time. The picosecond and the femtosecond are units of time. The picosecond is one trillionth of a second ($10^{-12}$ second), and the femtosecond is one quadrillionth of a second ($10^{-15}$ second), which are too short for a human to recognize. The reason for classifying the laser systems based on the unit of time is that the pulse duration of the picosecond laser system is one trillionth of a second and the pulse duration of the femtosecond laser system is one quadrillionth of a second. Laser processing serves to form or remove a pattern using energy. When the energy of a laser is applied to an object, thermal energy melts the object so as to form a predetermined pattern. As the pulse duration increases, a thermal effect, in which heat is transferred to the region surrounding the part in which a pattern is formed, may occur. Due to this thermal effect, heat may accumulate in the region surrounding the part of an object to which a laser is radiated, and thus the region surrounding a predetermined pattern may be burned or deformed by heat. Due to these characteristics of a laser, the shorter the laser pulse duration, the smaller the amount of heat that accumulates in an object, thereby realizing a desired pattern without deformation of the object. A picosecond laser system or a femtosecond laser system may be applied to the present disclosure. Alternatively, a laser system having a lower specification, such as a nanosecond laser system, may be applied to the present disclosure. The size of a laser beam may be referred to as a spot, and the size of the spot may range from about 40 μm to about 60 μm, without being necessarily limited thereto, and may be variously changed. It is noted that a laser beam is radiated to the bottom surface of each layer on the basis of FIG. 5. When a laser beam is radiated to each layer, the diameter of the portion of the hole that is formed in the surface of each layer to which the laser beam is initially radiated may be greater than that of the portion of the hole that is formed in the opposite surface of each layer. The method of forming holes in the layers is not necessarily limited to laser processing. For example, the holes may be formed using a mold or by perforating the layers using pins when the layers are manufactured. Referring to FIG. 5, each hole may have a trapezoidal-shaped cross-section. For example, the diameter of the portion of the hole that is close to the source printed circuit board 300 may be relatively large, and the diameter of the opposite portion of the hole may be relatively small. The diameter of the portion of the hole that is close to the source printed circuit board 300 may be about 350 μm, and the diameter of the opposite portion of the hole that is far from the source printed circuit board 300 may be about 300 μm. However, the range of the diameter of the hole is not necessarily limited thereto. The cross-sectional structure of each hole may have a reversely tapered sidewall. The reversely tapered holes may advantageously promote the smooth discharge of air and prevent the introduction of foreign substances.

The holes in the first layer 610 can have a polygonal shape. The holes in the second layer 620 and the holes in the third layer 630 can comprise at least one circular-shaped hole.

Figure 6A:
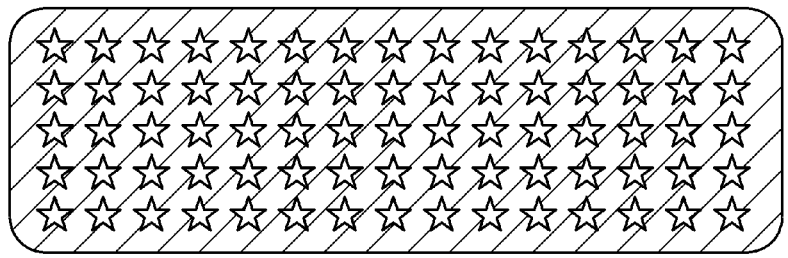
FIGS. 6A to 6C are plan views of layers according to an embodiment of the present disclosure.
Figure 6B:
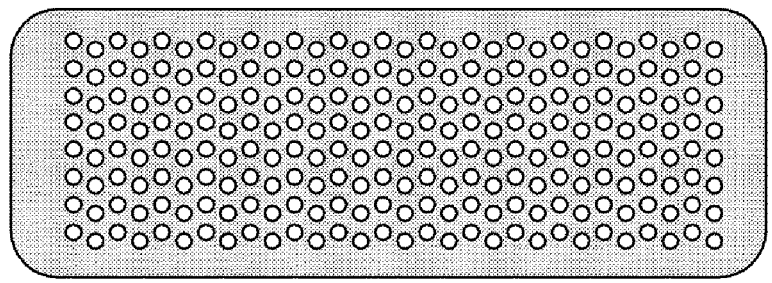
Figure 6C:
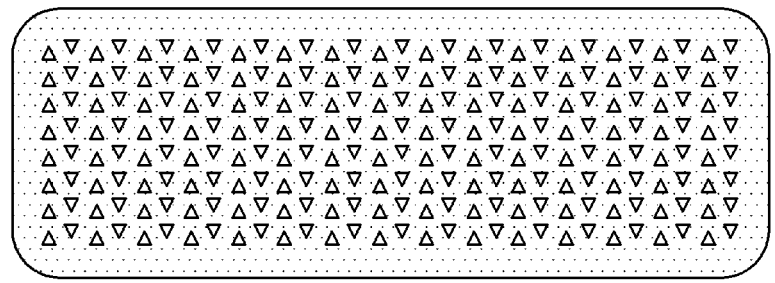

FIGS. 6A to 6C are views showing the shapes of patterns that may be applied to each layer.

FIG. 6A shows a pattern that may be applied to the first layer 610. In order to maximize dissipation of heat generated from the source printed circuit board 300, holes having a relatively large diameter, e.g., star-shaped holes, may be formed in the first layer 610. Since the first layer 610 is in direct contact with the source printed circuit board 300, the holes formed in the first layer 610 may have a pattern in which the holes are formed in a relatively large area expanding close to the corners of the first layer 610, thereby improving the heat dissipation efficiency.

FIG. 6B shows a pattern that may be applied to the second layer 620, which is disposed above the first layer 610. Circular-shaped holes, which have a smaller diameter than the holes formed in the first layer 610, may be formed in the second layer 620. The relatively small circular-shaped holes may be disposed more densely than the star-shaped holes, thereby making the introduction of foreign substances more difficult while securing smooth discharge of air.

FIG. 6C shows a pattern that may be applied to the third layer 630. Referring to FIG. 6C, holes having a much smaller diameter, e.g., triangular-shaped holes, may be formed in the third layer 630. The triangular-shaped holes may have the smallest size, and may be disposed most densely in the third layer 630. As described above with reference to FIG. 5, the hole formed in each layer may have a trapezoidal-shaped cross-section in which the diameter of the portion of the hole that is close to the source printed circuit board 300 is relatively large. Further, the sizes of the holes may gradually decrease from the first layer 610 to the third layer 630, and it may thus be difficult for foreign substances to pass through the third layer 630, which is the top layer. However, the diameters of the holes formed in the layers are not limited thereto. The holes in the first layer 610 may have the smallest diameter, and the holes in the third layer 630 may have the largest diameter. Alternatively, the holes formed in all of the layers may have the same diameter.

Figure 7:
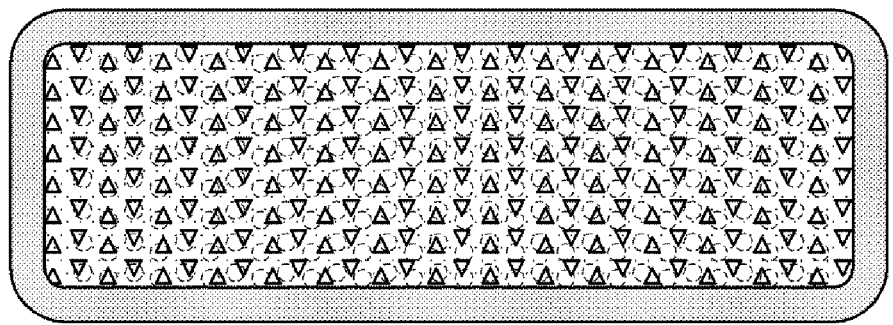
FIG. 7 is a plan view when of layers shown in FIGS. 6A to 6C stacked on each other.

FIG. 7 shows a planar structure obtained when the layers shown in FIGS. 6A to 6C are stacked. Referring to FIG. 7, the holes formed in the third layer 630 may be located at the top of the cover shield 600.

Figure 8:
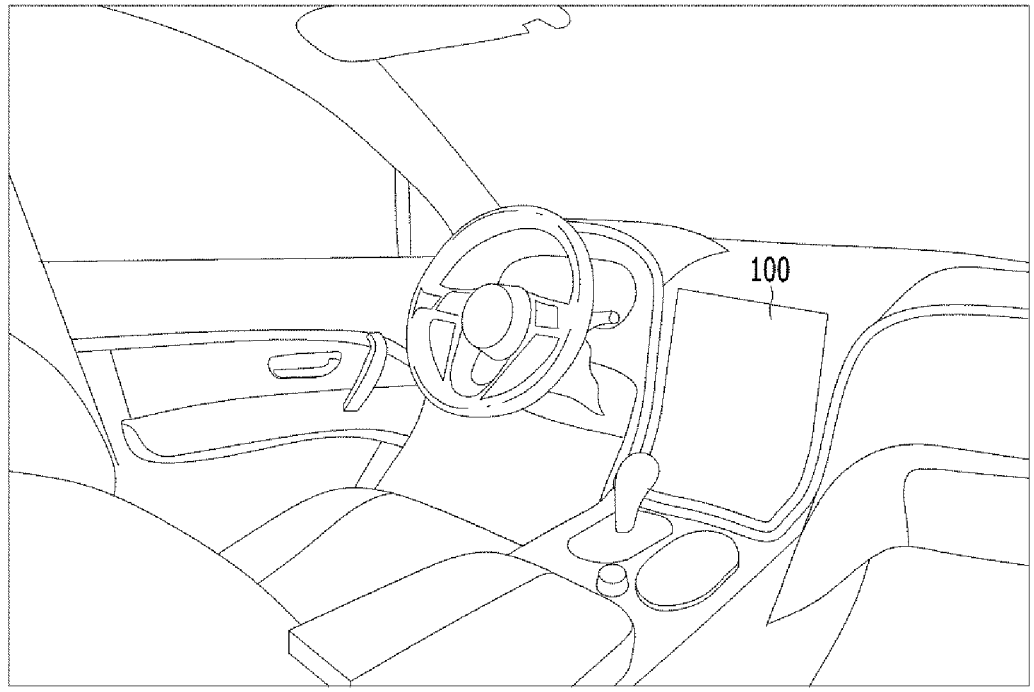
FIG. 8 is a view showing the interior of a vehicle in which the display apparatus according to an embodiment of the present disclosure is embedded.

FIG. 8 shows the interior of a vehicle in which the display apparatus 100 according to the embodiment shown in FIGS. 5 to 7 is mounted. The display apparatus 100 may be inserted into the dashboard or the center fascia of the vehicle so that a driver or a passenger is capable of using an infotainment system.

The display apparatus according to the embodiment of the present disclosure includes a liquid crystal display (LCD) apparatus, a field emission display (FED) apparatus, an organic light-emitting display (OLED) apparatus, and a quantum dot display apparatus.

A display apparatus according to an embodiment of the present disclosure may be explained as follows.

A display apparatus according to an embodiment of the present disclosure may include a guide plate disposed on the rear surface of a display panel, a printed circuit board disposed on the top surface of the guide plate, a component disposed on the top surface of the printed circuit board, and a protective member configured to cover the printed circuit board and the component.

In the display apparatus according to the embodiment of the present disclosure, at least a portion of the protective member may be in contact with the guide plate.

In the display apparatus according to the embodiment of the present disclosure, the protective member may include a first layer, a second layer, and a third layer.

In the display apparatus according to the embodiment of the present disclosure, each of the first layer, the second layer, and the third layer may include holes formed therein.

In the display apparatus according to the embodiment of the present disclosure, in a region in which the component is disposed, the holes in the first layer, the holes in the second layer, and the holes in the third layer may be overlapped with each other.

In the display apparatus according to the embodiment of the present disclosure, the holes in the first layer may have a polygonal shape.

In the display apparatus according to the embodiment of the present disclosure, the holes in the second layer and the holes in the third layer may include at least one circular-shaped hole.

In the display apparatus according to the embodiment of the present disclosure, the protective member may include a plurality of holes formed therein, and each of the holes may be formed such that the width of an opening in a first side surface thereof is greater than the width of an opening in a second side surface thereof.

In the display apparatus according to the embodiment of the present disclosure, the first side surface may be adjacent to the top surface of the printed circuit board, and the second side surface may be contiguous with the top surface of the protective member.

A display apparatus according to another embodiment of the present disclosure may include a display module including a display panel and a guide plate, a flexible printed circuit board extending from the display panel, a source printed circuit board connected to the flexible printed circuit board and attached to the guide plate, at least one driving chip disposed on the source printed circuit board, and a protective member disposed to cover the flexible printed circuit board, the source printed circuit board, and the driving chip.

In the display apparatus according to the embodiment of the present disclosure, the protective member may include a first layer, a second layer, and a third layer.

In the display apparatus according to the embodiment of the present disclosure, the protective member may include a plurality of holes formed therein, and each of the holes may have a reversely tapered sidewall.

In the display apparatus according to the embodiment of the present disclosure, at least a portion of the protective member may be in contact with the guide plate.

In the display apparatus according to the embodiment of the present disclosure, each of the first layer, the second layer, and the third layer may include holes formed therein.

In the display apparatus according to the embodiment of the present disclosure, in a region in which at least one driving chip is disposed, the holes in the first layer, the holes in the second layer, and the holes in the third layer are overlapped with each other.

In the display apparatus according to the embodiment of the present disclosure, the protective member may include a plurality of holes formed therein, and each of the holes may be formed such that the width of an opening in a first side surface thereof is greater than the width of an opening in a second side surface thereof.

In the display apparatus according to the embodiment of the present disclosure, the first side surface may be adjacent to the top surface of the printed circuit board, and the second side surface may be contiguous with the top surface of the protective member.

According to another embodiment of the present disclosure, a display device for a vehicle is provided, wherein the display device comprises any one of above display apparatus.

As is apparent from the above description, in a display apparatus according to the embodiment of the present disclosure, a guide plate is applied to the rear surface of the display panel, thereby supporting the display panel and the cover glass and enabling the display apparatus to be attached and fixed to the dashboard of a vehicle.

In a display apparatus according to the embodiment of the present disclosure, a cover shield may be attached to the printed circuit board. The cover shield may protect the printed circuit board by preventing various foreign substances from touching the printed circuit board. In addition, when the printed circuit board is subjected to physical contact with an external object or external impacts, the cover shield may protect the printed circuit board.

In a display apparatus according to the embodiment of the present disclosure, since the cover shield is composed of multiple layers, it may more stably protect the printed circuit board.

In a display apparatus according to the embodiment of the present disclosure, a portion of the cover shield may be attached to the guide plate, thereby more reliably protecting the printed circuit board. Since a portion of the cover shield is attached to the guide plate, adhesion to the printed circuit board may be improved, and the cover shield may be grounded through the guide plate.

In a display apparatus according to the embodiment of the present disclosure, since the cover shield includes holes formed therein, the heat generated from components disposed on the printed circuit board may be effectively dissipated, and thus it is possible to prevent increased power consumption and damage to the display panel attributable to an increase in temperature.

In a display apparatus according to the embodiment of the present disclosure, a hole is formed in the cover shield such that the diameter of the portion of the hole that is close to the printed circuit board is relatively large and the diameter of the opposite portion of the hole is relatively small, thereby preventing the introduction of external foreign substances and securing smooth air convection.

However, the effects achievable through the disclosure are not limited to the above-mentioned effects, and other effects not mentioned herein will be clearly understood by those skilled in the art from the above description.

The features, structures, effects, and the like described in association with the embodiments above are incorporated into at least one embodiment of the present disclosure, but should not be construed to limit the disclosure only to the one embodiment. Furthermore, the features, structures, effects, and the like exemplified in association with respective embodiments can be implemented in other embodiments through combination or modification by those skilled in the art. Therefore, content related to such combinations and modifications should be construed as falling within the scope of the present disclosure.

While the present disclosure has been particularly described with reference to exemplary embodiments, the present disclosure is not limited thereto. It will be understood by those skilled in the art that various replacements, modifications and applications, which are not illustrated above, may be made without departing from the spirit and scope of the present disclosure. For example, each component illustrated in the embodiments may be modified and made. It should be interpreted that differences related to these modifications and applications are included in the scope of the disclosure, which is defined by the appended claims and equivalents thereto.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display apparatus, comprising:
a display panel having a rear surface;
a guide plate disposed on the rear surface of the display panel and having a first top surface;
a printed circuit board disposed on the first top surface of the guide plate and having a second top surface;
a component disposed on the second top surface of the printed circuit board, wherein the component is at least one of a drive integrated circuit or a driving chip; and
a protective member on the printed circuit board that covers the printed circuit board and the component,
wherein the protective member includes a first layer, a second layer, and a third layer, and
wherein the second layer is disposed directly on the first layer and the third layer is disposed directly on the second layer.

2. The display apparatus according to claim 1, wherein at least a portion of the protective member is in contact with the guide plate.

3. The display apparatus according to claim 1, wherein each of the first layer, the second layer, and the third layer include holes.

4. The display apparatus according to claim 3, wherein the holes in the first layer, the holes in the second layer, and the holes in the third layer are overlapped with each other in a region proximate to the component.

5. The display apparatus according to claim 3, wherein the holes in the first layer have a polygonal shape.

6. The display apparatus according to claim 3, wherein the holes in the second layer and the holes in the third layer each include at least one circular-shaped hole.

7. The display apparatus according to claim 1, wherein the protective member has a first side surface and a second side surface and includes a plurality of holes, and
wherein each of the plurality of holes has a first opening in the first side surface and a second opening in the second side surface of the protective member, the first opening having a width that is greater than a width of the second opening.

8. The display apparatus according to claim 7, wherein the first side surface is adjacent to the second top surface of the printed circuit board, and
wherein the protective member has a third top surface that is contiguous with the second side surface of the protective member.

9. The display apparatus according to claim 1, wherein the first layer and the second layer include an insulating material, and the third layer includes a conductive material.

10. The display apparatus according to claim 9, wherein the first layer includes a plastic film, the second layer includes an insulating tape, and the third layer includes a conductive tape.

11. A display apparatus, comprising:
a display module including a display panel and a guide plate disposed on the display panel;
a flexible printed circuit board coupled to the display panel;
a source printed circuit board connected to the flexible printed circuit board and coupled to the guide plate;
at least one driving chip disposed on the source printed circuit board; and
a protective member that covers the flexible printed circuit board, the source printed circuit board, and the at least one driving chip,
wherein the protective member includes a first layer, a second layer, and a third layer, and
wherein the second layer is disposed directly on the first layer and the third layer is disposed directly on the second layer.

12. The display apparatus according to claim 11, wherein the protective member includes a plurality of holes, and
wherein the protective member has a plurality of tapered sidewalls defining the plurality of holes.

13. The display apparatus according to claim 11, wherein at least a portion of the protective member is in contact with the guide plate.

14. The display apparatus according to claim 11, wherein each of the first layer, the second layer, and the third layer include holes.

15. The display apparatus according to claim 14, wherein the holes in the first layer, the holes in the second layer, and the holes in the third layer are overlapped with each other in a region proximate to the at least one driving chip.

16. The display apparatus according to claim 11, wherein the protective member has a first surface and a second surface and includes a plurality of holes, and wherein each of the plurality of holes has a first opening in the first surface and a second opening in the second surface of the protective member, the first opening having a width that is greater than a width of the second opening.

17. The display apparatus according to claim 16, wherein the source printed circuit board has a first top surface adjacent to the first surface of the protective member, and wherein the protective member includes a second top surface that is contiguous with the second surface of the protective member.

18. The display apparatus according to claim 11, wherein the first layer and the second layer include an insulating material, and the third layer includes a conductive material.

19. The display apparatus according to claim 18, wherein the first layer includes a plastic film, the second layer includes an insulating tape, and the third layer includes a conductive tape.

\* \* \* \* \*